United States Patent
Freimann et al.

(10) Patent No.: US 10,101,667 B2
(45) Date of Patent: Oct. 16, 2018

(54) METHOD FOR ALIGNING A MIRROR OF A MICROLITHOGRAPHIC PROJECTION EXPOSURE APPARATUS

(71) Applicant: Carl Zeiss SMT GmbH, Oberkochen (DE)

(72) Inventors: Rolf Freimann, Aalen (DE); Bernd Doerband, Aalen (DE); Jochen Hetzler, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/284,967

(22) Filed: Oct. 4, 2016

(65) Prior Publication Data

US 2017/0023865 A1    Jan. 26, 2017

Related U.S. Application Data

(63) Continuation of application No. PCT/EP2015/056843, filed on Mar. 30, 2015.

(30) Foreign Application Priority Data

Apr. 4, 2014    (DE) .................. 10 2014 206 589

(51) Int. Cl.
    *G03B 27/42*    (2006.01)
    *G03F 7/20*    (2006.01)

(52) U.S. Cl.
    CPC .......... *G03F 7/70141* (2013.01); *G03F 7/706* (2013.01); *G03F 7/70233* (2013.01); *G03F 7/70258* (2013.01)

(58) Field of Classification Search
    CPC .. G03F 7/70141; G03F 7/706; G03F 7/70258; G03F 7/70633; G03F 7/7085;
    (Continued)

(56) References Cited

U.S. PATENT DOCUMENTS

| 4,872,755 A | 10/1989 | Kuechel |
| 7,538,856 B2 | 5/2009 | Kajiyama et al. |
| 7,605,926 B1 | 10/2009 | Hetzler et al. |
| 8,228,485 B2 | 7/2012 | Freimann et al. |

(Continued)

FOREIGN PATENT DOCUMENTS

| DE | 37 07 331 A1 | 9/1988 |
| DE | 10 2005 021 783 A1 | 11/2006 |

(Continued)

OTHER PUBLICATIONS

Wang Shanshan et al.; Criterion of phasing in the presence of segment aberrations; Proceedings of SPIE—The International Society for Optical Engineering Sep. 26, 2007; vol. 6625, 7 pages.

(Continued)

*Primary Examiner* — Masfin Asfaw
(74) *Attorney, Agent, or Firm* — Edell, Shapiro & Finnan, LLC

(57) ABSTRACT

A method for aligning a mirror of a microlithographic projection exposure apparatus, according to one formulation, involves: recording a first partial interferogram between a wave reflected at a first mirror segment (101) and a reference wave reflected at a reference surface (110, 310, 510), recording a second partial interferogram between a wave reflected at a second mirror segment (102) and a reference wave reflected at the reference surface, determining a phase offset between the first partial interferogram and the second partial interferogram, and aligning the first mirror segment and the second mirror segment in relation to one another in accordance with the determined phase offset, so that the distance of the relevant mirror segments (101, 102) from a respective predetermined, hypothetical surface in the direction of the respective surface normal is less than $\lambda/10$ at each point on the mirror segments, where $\lambda$ denotes the operating wavelength of the mirror.

19 Claims, 13 Drawing Sheets

(58) Field of Classification Search
CPC ............... G03F 9/7088; G03F 7/70266; G03F 7/70825; G03F 9/7076; G03F 7/7015; G03F 7/70775; G03F 9/7003; G03F 7/70191; G03F 7/702; G03F 7/70308; G03F 7/70516; G03F 7/70075
See application file for complete search history.

(56) References Cited

U.S. PATENT DOCUMENTS

| | | |
|---|---|---|
| 2002/0145718 A1 | 10/2002 | Dinger |
| 2005/0146701 A1 | 7/2005 | Holderer et al. |
| 2009/0002663 A1 | 1/2009 | Freimann et al. |
| 2009/0231593 A1 | 9/2009 | Freimann et al. |
| 2010/0271636 A1 | 10/2010 | Naoi et al. |
| 2011/0001947 A1 | 1/2011 | Dinger et al. |
| 2012/0229814 A1 | 9/2012 | Freimann et al. |
| 2012/0300183 A1 | 11/2012 | Schaffer et al. |
| 2013/0242278 A1* | 9/2013 | Enkisch .............. G03F 7/70308 355/71 |
| 2016/0195817 A1* | 7/2016 | Enkisch .............. G03F 7/70308 355/71 |

FOREIGN PATENT DOCUMENTS

| | | |
|---|---|---|
| DE | 102010043498 A1 | 5/2012 |
| DE | 102012202675 A1 | 1/2013 |
| DE | 10 2012 209 412 A1 | 12/2013 |
| DE | 10 2014 207 883 A1 | 7/2014 |
| WO | 03093903 A2 | 11/2003 |
| WO | 2012059537 A1 | 5/2012 |

OTHER PUBLICATIONS

Song Helun et al.; "Technology of co-phasing of the segmented mirrors based on a Michelson interferometric system"; Chinese Journal of Lasers May 2008; vol. 35, 5 pages; with English abstract.

Max Born et al.; "Principles of Optics" 7th expanded edition; pp. 518-522; ISBN-13 978-0-521-64222-4.

Wang Shanshan et al.; Criterion of phasing in the presence of segment aberrations; Proceedings of SPIE—The International Society for Optical Engineering Sep. 26, 2007; vol. 6625. (Abstract Only).

Feenix Y. Pan et al., "Efficient testing of segmented aspherical mirrors by use of reference plate and computer-generated Holograms", I. Theory and system optimization, Oct. 1, 2004, vol. 43, No. 28, Applied Optics, pp. 5303-5312.

Feenix Y. Pan et al., "Efficient testing of segmented aspherical mirrors by use of a reference plate and computer-jeneratedHolograms", II. Case study, error analysis, and experimental validation, Oct. 1, 2004, vol. 43, No. 28, Applied Optics, pp. 5313-5322.

Song Helun et al.; "Technology of co-phasing of the segmented mirrors based on a Michelson interferometric system"; Chinese Journal of Lasers May 2008; vol. 35. (Abstract Only).

International Preliminary Report on Patentability and Written Opinion in counterpart International Application No. PCT/EP2015/056843, dated Oct. 4, 2016, 19 pages.

Office Action in corresponding German Application 102014206589.5, dated Oct. 4, 2016, along with English Translation.

International Search Report and Written Opinion in counterpart International Application No. PCT/EP2015/056843, dated Jul. 16, 2015.

Escobar-Romero, F. et al., "Phasing a segmented mirror using the subapertures method", Eighth International Symposium on Laser Metrology, Feb. 14, 2015, p. 546-552.

Klumpe III, H. W. et al., "Absolute phasing of segmented mirrors using the polarization phase sensor", Review of Scientific Instruments, AIP, vol. 63, No. 2, Feb. 1, 1992, p. 1698-1706.

* cited by examiner

METHOD FOR ALIGNING A MIRROR OF A MICROLITHOGRAPHIC PROJECTION EXPOSURE APPARATUS

CROSS REFERENCE TO RELATED APPLICATIONS

This is a Continuation of International Application PCT/EP2015/056843, which has an international filing date of Mar. 30, 2015, and the disclosure of which is incorporated in its entirety into the present Continuation by reference. The following disclosure is also based on and claims the benefit of and priority under 35 U.S.C. § 119(a) to German Patent Application No. DE 10 2014 206 589.5, filed Apr. 4, 2014, which is also incorporated in its entirety into the present Continuation by reference.

FIELD OF THE INVENTION

The invention relates to a method for aligning a mirror of a microlithographic projection exposure apparatus and a mirror aligned in this manner.

BACKGROUND

Microlithography is used for producing microstructured components, such as integrated circuits or LCDs, for example. The microlithography process is carried out in a so-called projection exposure apparatus having an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

The operating wavelength of the system, abbreviated to "operating wavelength" here and in the following, is the wavelength of the light at which the illuminated mask is optically imaged onto the substrate. If the light has a notable bandwidth, the operating wavelength is understood to mean the central wavelength.

In projection lenses designed for the extreme ultraviolet (EUV) range, i.e. at wavelengths of e.g. approximately 13 nm or approximately 7 nm, owing to the lack of availability of suitable light-transmissive refractive materials, mirrors are used as optical components for the imaging process. Typical projection lenses designed for EUV, as are known e.g. from U.S. Pat. No. 7,538,856 B2, may, for example, have an image-side numerical aperture (NA) in the range of NA=0.2 to 0.3 and image an (e.g. ring-segment-shaped) object field (also referred to as "scanner slit") into the image plane or wafer plane. A problem arising in practice in the case of approaches for increasing the image-side numerical aperture (NA) is that, in many respects, there are limits to increasing the size of the mirror surfaces required to accommodate this increase in image-side NA:

Firstly, it becomes increasingly difficult with increasing dimensions of the mirrors to reduce long-wave surface errors, in particular, to values below the required thresholds, with the larger mirror surfaces requiring, inter alia, stronger aspheres. Moreover, larger processing machines are required for manufacturing purposes in the case of increasing dimensions of the mirrors, and stricter requirements are placed upon the employed processing tools (such as e.g. grinding, lapping and polishing machines, interferometers, cleaning and coating installations). Furthermore, heavier mirror bases need to be used for the purposes of manufacturing larger mirrors, which mirror bases are only barely able to be assembled above a certain limit or bending beyond an acceptable measure due to gravity. Moreover, as the mirror dimensions increase, so does the operating outlay required to manufacture a mirror anew if even only a comparatively small portion ("scratch") becomes damaged on the mirror.

In order to accommodate the problems associated with the increasing mirror dimensions mentioned above, it is known to fashion one or more mirrors in the imaging beam path of the projection lens in a segmented manner, i.e. to replace each monolithic mirror by a segmented mirror which is composed of a plurality of separate mirror segments.

When using such segmented mirrors in a microlithographic projection exposure apparatus, it is very important to avoid bothersome wavefront jumps between the partial beam paths emanating from the individual mirror segments. A further problem encountered in this situation is that the microlithographic imaging process for generating a sharp image requires not only the correct geometric-optical superposition of the images generated by the individual partial beam paths in the image plane of the projection lens but also the superposition thereof with the correct phase, i.e. it requires the individual mirror segments of the segmented mirror to have a common phase angle.

A common phase angle of the mirror segments of a segmented mirror should not only be set prior to first activating the system (e.g. after the system has been transported) but it should also be re-established after replacing one or more mirror segments of the segmented mirror, for example.

In respect of the prior art, reference is made in a purely exemplary manner to WO 2012/059537 A1, US 2012/0300183 A1, US 2011/0001947 A1, WO 03/093903 A2 and U.S. Pat. No. 8,228,485 B2.

SUMMARY

Against the aforementioned backdrop, it is an object of the present invention to provide a method for aligning a mirror of a microlithographic projection exposure apparatus which, together with the accuracy required for generating a sufficiently sharp imaging result, enables a common phase angle of the individual mirror segments of the segmented mirror.

This object is achieved by the features of the independent patent claims.

In accordance with one aspect of the invention, a method for aligning a mirror of a microlithographic projection exposure apparatus, the mirror having a plurality of mirror segments, comprises:

recording a first partial interferogram between a wave reflected at a first mirror segment and a reference wave reflected at a reference surface;

recording a second partial interferogram between a wave reflected at a second mirror segment and a reference wave reflected at the reference surface;

determining a phase offset between the first partial interferogram and the second partial interferogram; and aligning the first mirror segment and the second mirror segment in relation to one another on the basis of the determined phase offset in such a way that the distance of the relevant mirror segments from a notional, predetermined intended surface in the direction of the respective surface normal is less than $\lambda/10$ at each point on the mirror segments, where $\lambda$ denotes the operating wavelength.

In accordance with one embodiment, alignment is brought about in such a way that the distance of the relevant mirror segments from a notional, predetermined intended surface in the direction of the respective surface normal is less than $\lambda/50$, in particular less than $\lambda/100$, at each point on the mirror segments.

The alignment according to the invention can be carried out during, or after, the segment manufacturing, during the segment assembly, on the segmented mirror installed into the projection exposure apparatus or into the scanner, or on the scanner after replacing a mirror segment.

In accordance with a further aspect, a method according to the invention for aligning a mirror of a microlithographic projection exposure apparatus, the mirror having a plurality of mirror segments, comprises:

splitting a first wavefront after reflection at a first mirror segment;

splitting a second wavefront after reflection at a second mirror segment;

interferometric superposition of wavefronts, generated by splitting the first wavefront, amongst themselves with the generation of a first partial interferogram;

interferometric superposition of wavefronts, generated by splitting the second wavefront, amongst themselves with the generation of a second partial interferogram;

determining a phase offset between the first partial interferogram and the second partial interferogram; and aligning the first mirror segment and the second mirror segment in relation to one another on the basis of the determined phase offset.

In accordance with one embodiment, aligning the first mirror segment and the second mirror segment in relation to one another on the basis of the determined phase offset is carried out in such a way that the distance of the relevant mirror segments from a notional, predetermined intended surface in the direction of the respective surface normal is less than $\lambda/10$, in particular less than $\lambda/50$, and furthermore, in particular, less than $\lambda/100$, at each point on the mirror segments, where $\lambda$ denotes the operating wavelength.

In particular, the invention contains the concept of relating wavefronts, generated by reflection at adjoining mirror segments (between which wavefronts there is a "wavefront gap" in each case due to the segment boundaries present between the mirror segments), to one another in interferometric terms in order to undertake an alignment of the mirror segments in relation to one another on the basis of the determined distance, of the relevant mirror segments in the direction of the surface normal ("segment height difference"), which distance is proportional to the phase angle difference.

Within the meaning of the present application, a position of the mirror segments of the mirror with the correct phase preferably corresponds to an arrangement in which the distance of the relevant mirror segments from a notional area in the direction of the surface normal is less than $\lambda/10$ (where $\lambda$ denotes the operating wavelength of the projection exposure apparatus), wherein this condition is preferably satisfied for all locations on the optically effective surface of the mirror segments or of the mirror. The notional surface can be the reflecting surface which results from the optical design in each case and which should be realized by the mirror. In other words, said notional surface may represent the intended surface which should be formed by the mirror segments. It is typically continuous and may constitute, for example, a spherical surface, an aspherical surface or a free-form surface.

According to the invention, the alignment is carried out in such a way that adjacent mirror segments adjoin one another at the same "level". Satisfying the criterion that the distance of the relevant mirror segments from a notional, predetermined intended surface in the direction of the respective surface normal is less than $\lambda/10$ at each point on the mirror segments ensures that the spatial coherence of reflected electromagnetic radiation is maintained. Maintaining the spatial coherence in turn ensures that the point image generated by the imaging optical unit maintains its minimum diameter known from diffraction optics.

By way of the above-described realization according to the invention of a "correct-phase" alignment, the invention differs from conventional approaches, in particular, in which only a "correct-angle alignment", for example of facets of a facet mirror, is obtained. Obtaining spatial coherence is not ensured by a "correct-angle alignment", and so the point image generated by the imaging optical unit may be significantly "washed out" in a disadvantageous manner.

In particular, a distance of the relevant mirror segments from the notional surface or intended surface in the direction of the surface normals may also be required to be less than $\lambda/50$, in particular less than $\lambda/100$, for the correct phase of the mirror segments of the mirror.

The method for alignment can also be realized in the form of a pre-alignment as part of the manufacturing or assembly of the segmented mirror, for example during the mirror manufacturing or mirror testing, or mirror assembly. Here, in particular, there can also be a pre-alignment using measurement light at a comparatively long wavelength in a first step and a fine alignment at the operating wavelength of the system (less than e.g. 15 nm in the case of a projection exposure apparatus designed for EUV) in a second step.

The invention furthermore contains the concept of avoiding, during an interferometric distance or level determination of the mirror segments, a limitation to the extent that said distance or the level difference is only determinable modulo half a wavelength (also referred to as "modulo $\lambda/2$ limitation" below) by virtue of realizing different values of the quotient between geometric path and wavelength (i.e. the geometric path specified in multiples of the wavelength) in the partial beam paths either by the use of a comparatively broadband light source (or a plurality of discrete wavelengths) in combination with the use of an upstream cavity (for enabling the same geometric paths) or by the use of a suitable auxiliary structure (in particular a "reflector stud structure") for generating different geometric paths in combination with a single discrete operating wavelength.

In accordance with a further aspect, a method according to the invention for aligning a mirror of a microlithographic projection exposure apparatus is provided, the mirror having a plurality of mirror segments. The method includes:

generating an aerial image from a first wavefront reflected at a first mirror segment and a second wavefront reflected at a second mirror segment; and aligning the first mirror segment and the second mirror segment in relation to one another on the basis of an evaluation of said aerial image in such a way that the distance of the relevant mirror segments from a notional, predetermined intended surface in the direction of the respective surface normal is less than $\lambda/10$ at each point on the mirror segments, where $\lambda$ denotes the operating wavelength.

Here it is possible, in particular, to establish a stray light component or "washout disk" in the areal image, wherein the alignment of the first mirror segment and of the second mirror segment in relation to one another is carried out on the basis of this stray light component or the form of the "washout disk".

In accordance with one embodiment, alignment is brought about in such a way that the distance of the relevant mirror segments from a notional, predetermined intended surface in the direction of the respective surface normal is less than $\lambda/50$, in particular less than $\lambda/100$, at each point on the mirror segments.

The invention furthermore relates to a mirror which comprises a plurality of mirror segments which are aligned or assembled while carrying out a method in accordance with the features described above.

Further configurations of the invention can be gathered from the description and the dependent claims.

The invention is explained in greater detail below on the basis of exemplary embodiments illustrated in the accompanying figures.

DETAILED DESCRIPTION

Figure 9:
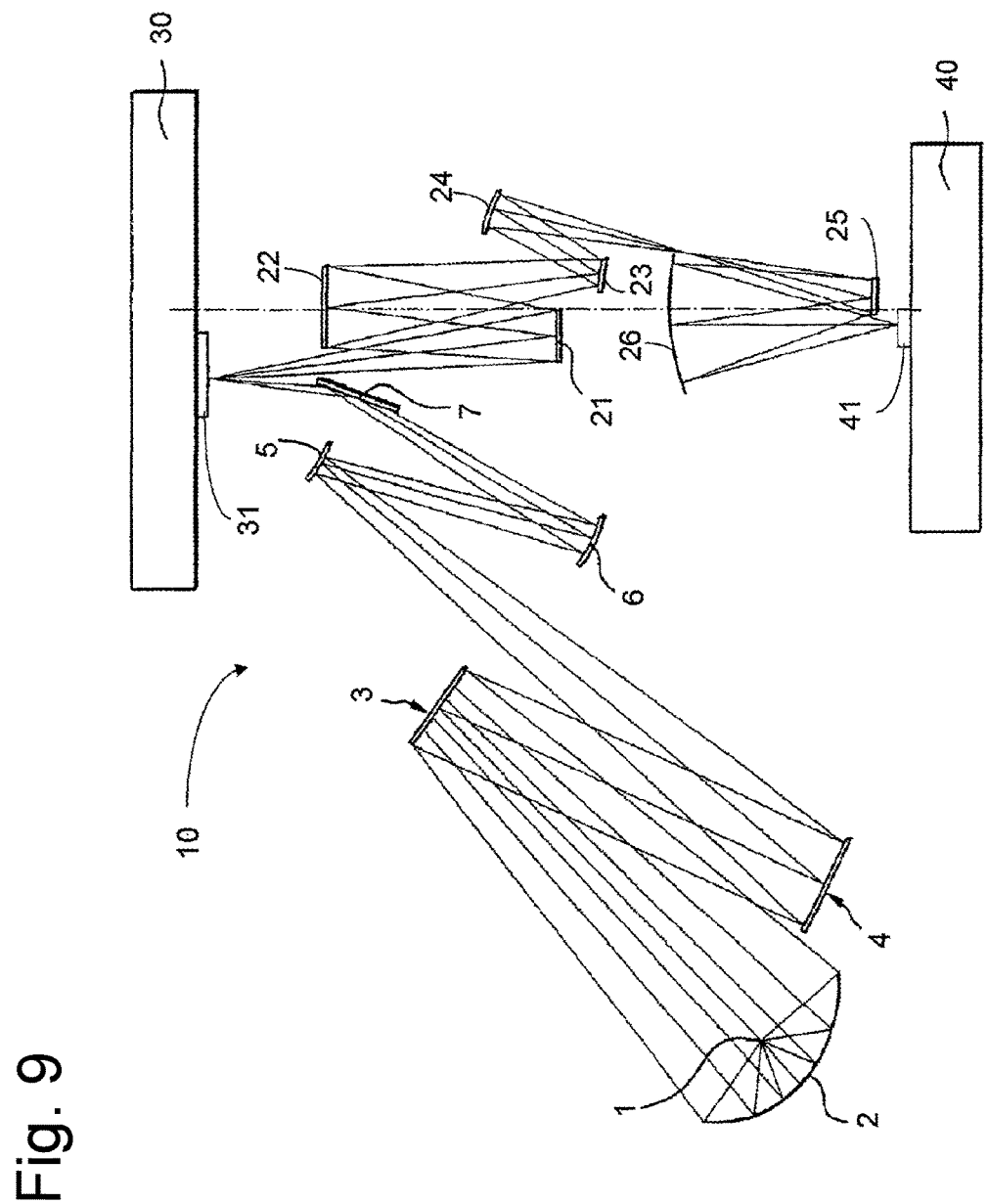
FIG. 9 shows a schematic illustration of a projection exposure apparatus designed for operation in EUV.

FIG. 9 shows a schematic illustration of an exemplary projection exposure apparatus which is designed for operation in the EUV and which can comprise a segmented mirror which can be aligned using a method according to the invention.

According to FIG. 9, an illumination device in a projection exposure apparatus 10 designed for operation in the EUV comprises a field facet mirror 3 and a pupil facet mirror 4. The light from a light source unit comprising a plasma light source 1 and a collector mirror 2 is directed onto the field facet mirror 3. A first telescope mirror 5 and a second telescope mirror 6 are arranged in the light path downstream of the pupil facet mirror 4. A deflection mirror 7 is arranged downstream in the light path, said deflection mirror directing the radiation that is incident on it onto an object field in the object plane of a projection lens comprising six mirrors 21-26. Arranged on a mask stage 30 at the location of the object field is a reflective structure-bearing mask 31, which with the aid of the projection lens is imaged into an image plane, in which there is a substrate 41 coated with a light-sensitive layer (photoresist) on a wafer stage 40.

Now, the assumption is made below that at least one mirror within the projection lens of the projection exposure apparatus 10, for example the last mirror 26 on the image-plane side in relation to the optical beam path (which has the largest reflecting surface), has a segmented configuration, i.e. it is composed of a plurality of separate mirror segments.

With reference to FIGS. 1 to 5, exemplary embodiments of the invention which respectively enable an axial position or level determination of the mirror segments of a segmented mirror are described first.

Figure 1:
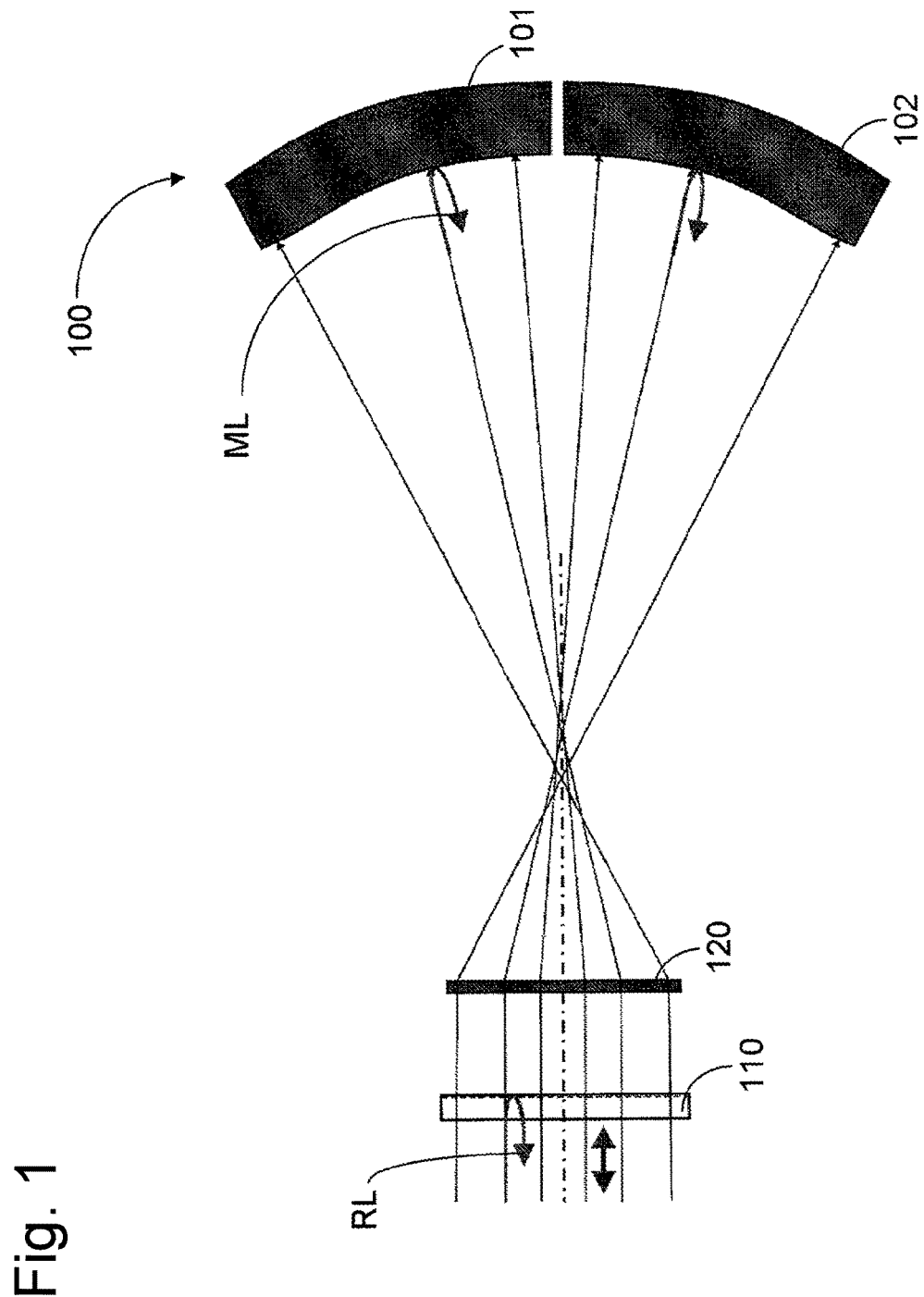
FIGS. 1-8 show schematic illustrations for explaining exemplary embodiments of the present invention.

FIG. 1 shows a schematic illustration for explaining a possible functional principle of an interferometric test arrangement for determining the distance between, or the levels of, two mirror segments 101, 102 of a segmented mirror 100. Here, a partial interferogram between a reference light RL reflected at a reference surface 110 ("Fizeau plate") and a measurement light ML reflected at the relevant mirror segment 102 is generated in each case in a Fizeau arrangement for each one of the mirror segments 101, 102. Here, the measurement light ML is formed into an aspherical wavefront by a computer-generated hologram (CGH) 120, which wavefront corresponds mathematically exactly to the "test object form" (i.e. the form of the relevant mirror segment 101 or 102) at an intended distance.

Figure 2:
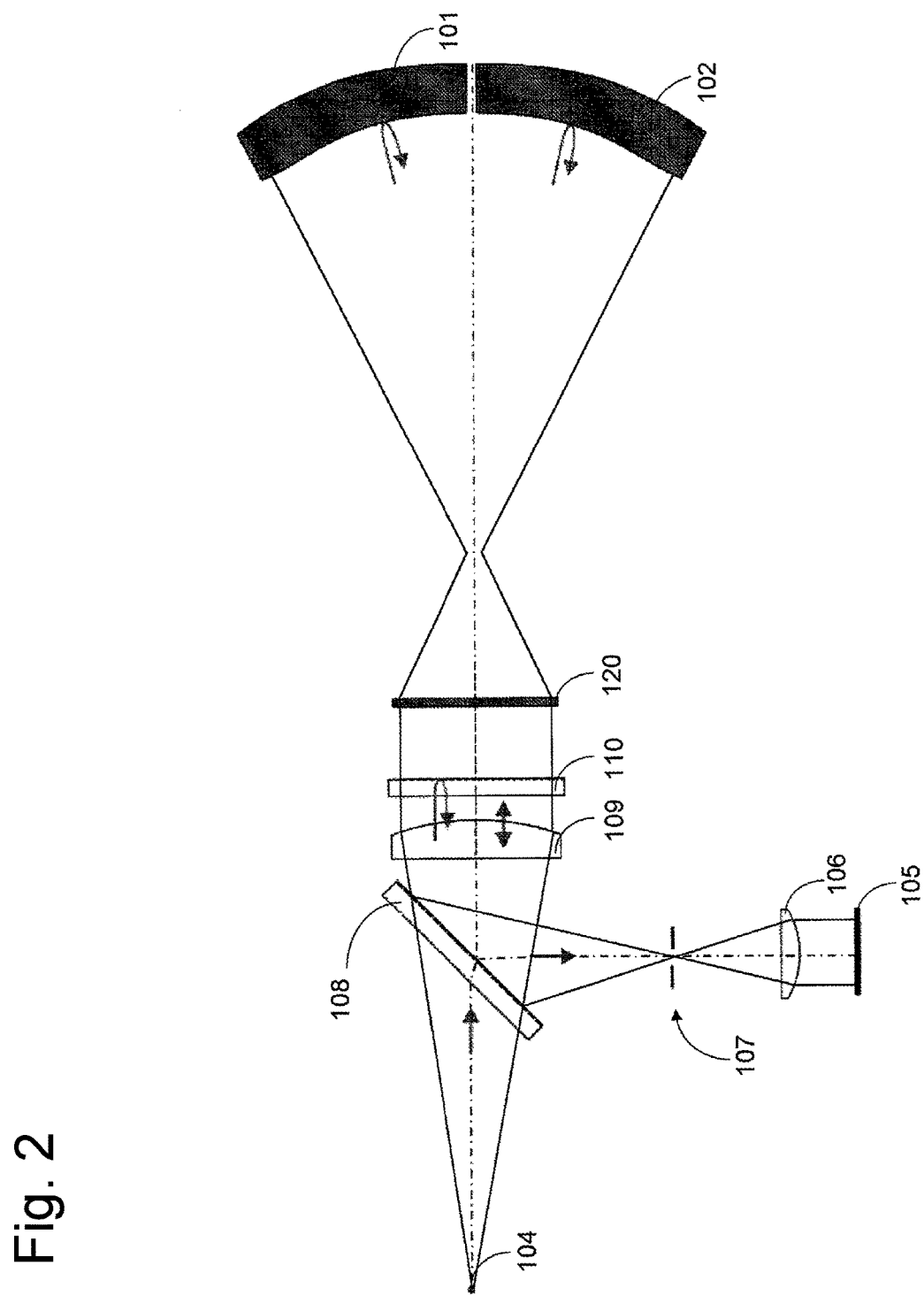

The wavefronts reflected firstly by the reference surface 110 and secondly by the relevant mirror segment 101, 102 or test object interfere with one another in the interferometer, which is schematically illustrated in terms of its overall design in FIG. 2 (for which interferometer FIG. 2, in addition to FIG. 1, also depicts a collimator 109, a beam splitter plate 108, a stop 107, an eyepiece 106 and a CCD camera 105 as well as a light source 104). The CCD camera 105 in each case records a partial interferogram of the respective mirror segment 101, 102.

The desired determination of the distance between, or the level of, the mirror segments 101, 102 of the segmented mirror 100 can in this case, as a matter of principle, be carried out by evaluating and comparing the two partial interferograms belonging to the mirror segments 101, 102. These differ from one another by a phase offset as a consequence of different distances from the CGH 120. The respectively obtained distance difference can then either be aligned to zero or kept available in an appropriate manner in the design of the respective optical system.

However, a fundamental problem is presented, in that the distance or the level difference between the mirror segments 101, 102 is only determinable "modulo half a wavelength" since the strips obtained in the partial interferograms are not distinguishable from one another. In particular, it is not possible to identify in the interferogram whether e.g. two spherical mirror segments have the same radius and the same distance from the CGH 120 or whether there is in each case a deviation of distance and radius, which both lead to the same result in the obtained partial interferograms.

Figure 3:
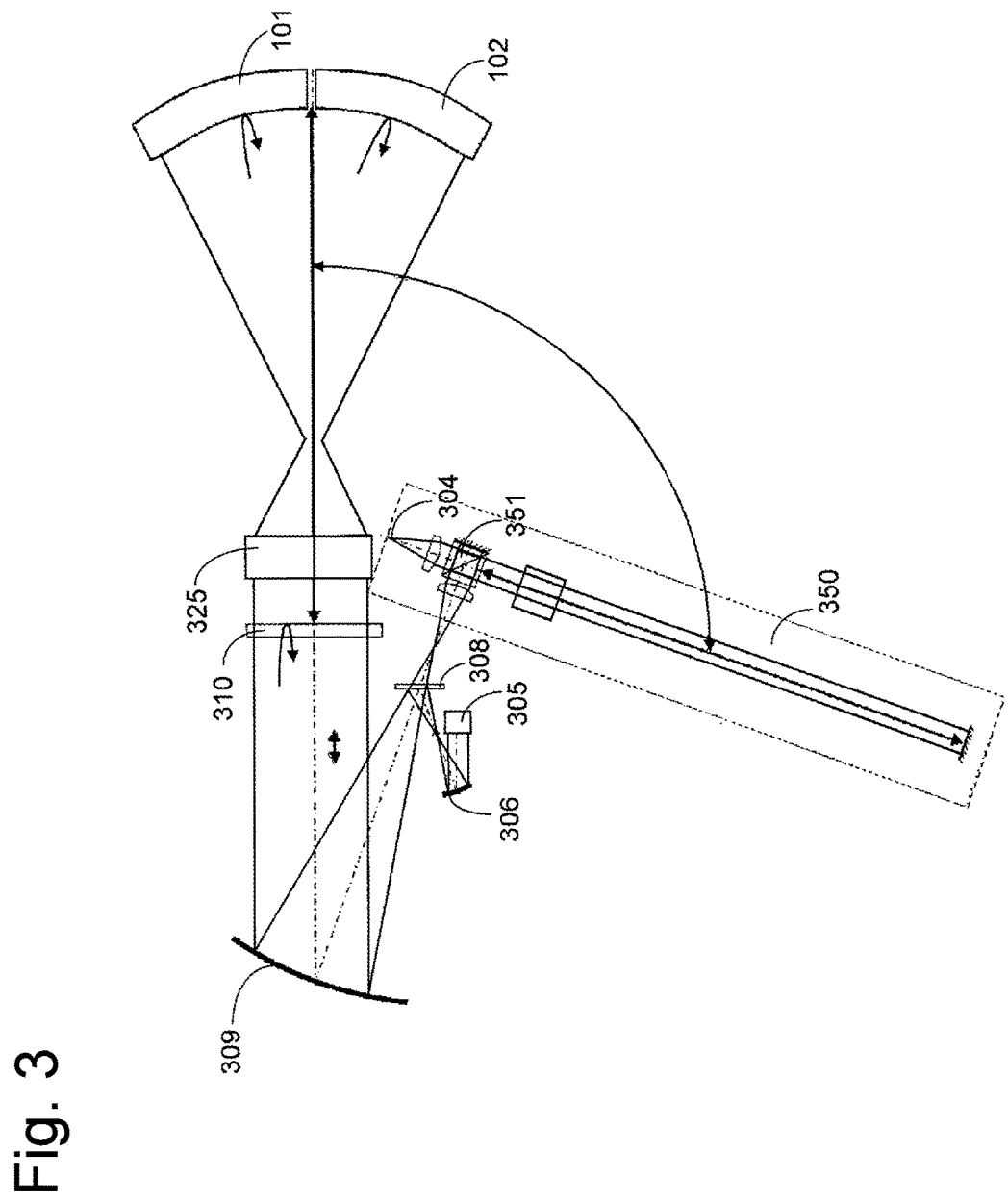

This circumstance is accounted for by the embodiment depicted in FIG. 3, wherein components which are analogous or have substantially the same function are denoted by reference signs increased by "200" in relation to FIG. 1 and FIG. 2. A comparatively broadband light source, for example an LED, is used as a light source 304 in this arrangement. Purely by way of example, the light source 304 may have a bandwidth of 1-10 nm. An achromatic compensation optical unit is denoted by "325". In further embodiments, it is also possible to use a plurality of discrete wavelengths in combination with a CGH designed for these wavelengths.

In the embodiment of FIG. 3, the use of a comparatively broadband light source 304 is combined with the use of a retardation section in the form of an upstream cavity 350 for enabling the same geometric paths in order to obtain a compensation of the distance between the reference surface 310 and the respective mirror segment 101, 102. This refinement is based on the idea that, when a broadband light source is used, it is only possible to superpose light which has passed over the same optical path. In order to realize this, taking into account the distance between the reference surface 310 and the mirror segment 101, 102 or test object present in the Fizeau arrangement of FIG. 2, use is made of the upstream cavity 350 which, in particular, comprises abeam splitter cube 351.

Figure 4:
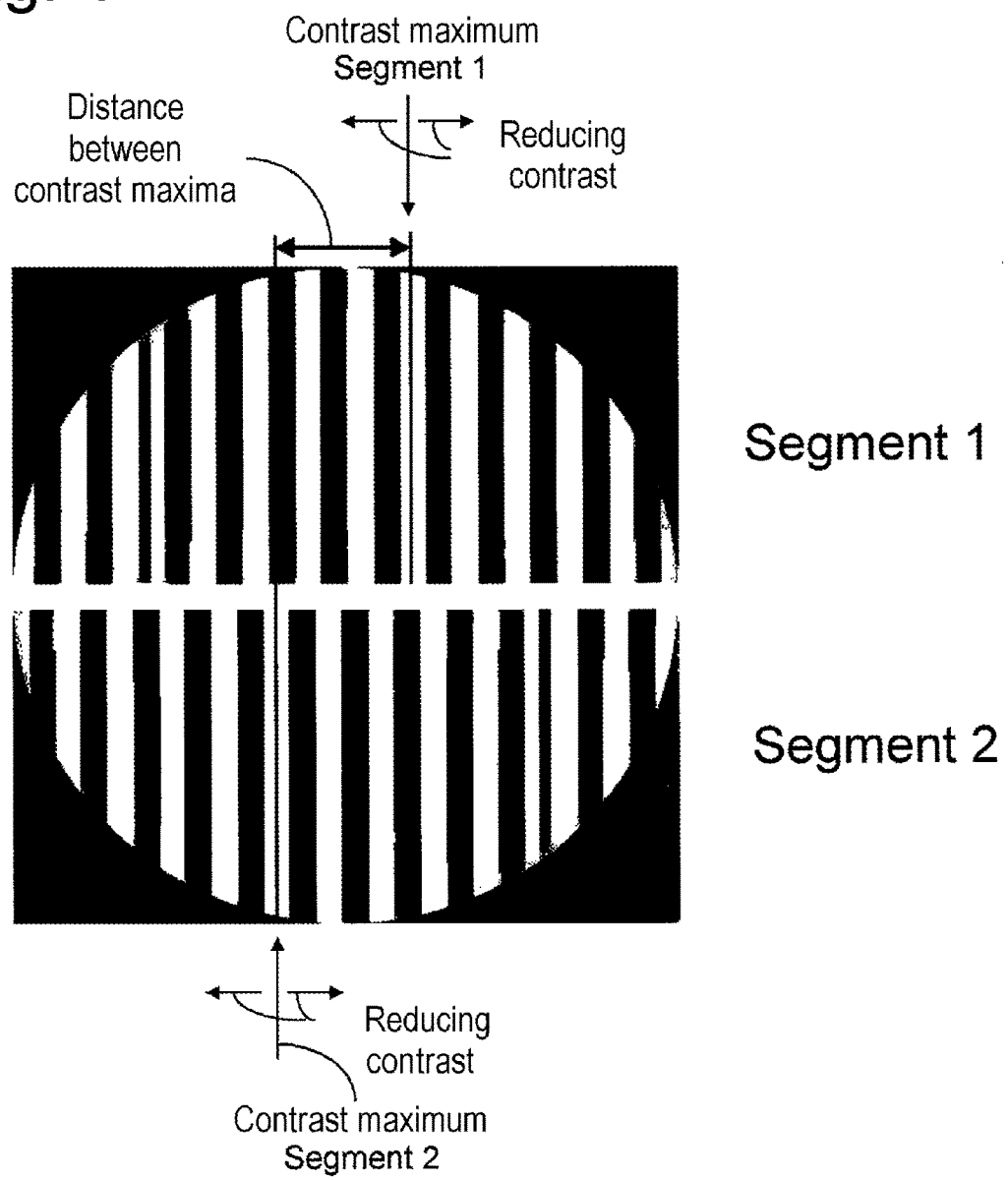

What is achieved by the additional splitting of light caused by the beam splitter cube 351 is that four alternatives for the possible beam path are created, depending on whether the reflection in the further beam path already takes place at the reference surface 310 or only at the respective mirror segment 101, 102. Only two paths of these four possible optical paths, namely the path extending over the "long" path in the upstream cavity 350 and extending at the reflection at the reference surface 310 on the one hand and the path extending over the "short" path in the upstream cavity 350 and extending at the reflection at the respective mirror segment on the other hand, can be set to have the same length, with the consequence that interference still emerges in the case of a shift of one of the mirror segments 101, 102 in relation to the respective other mirror segment 102, 101 by one wavelength, but this interference results in a deviating contrast such that it is possible to establish, in the two partial interferograms, the sought-after distance difference without the above-explained "modulo $\lambda/2$ limitation" from the relative position of the contrast maxima, as indicated in FIG. 4.

The above-described method or the arrangement depicted in FIG. 3 can be used both for parallel or simultaneous measurement of the mirror segments 101, 102 and for the temporally successive or sequential measurement of the mirror segments 101, 102.

Figure 5:
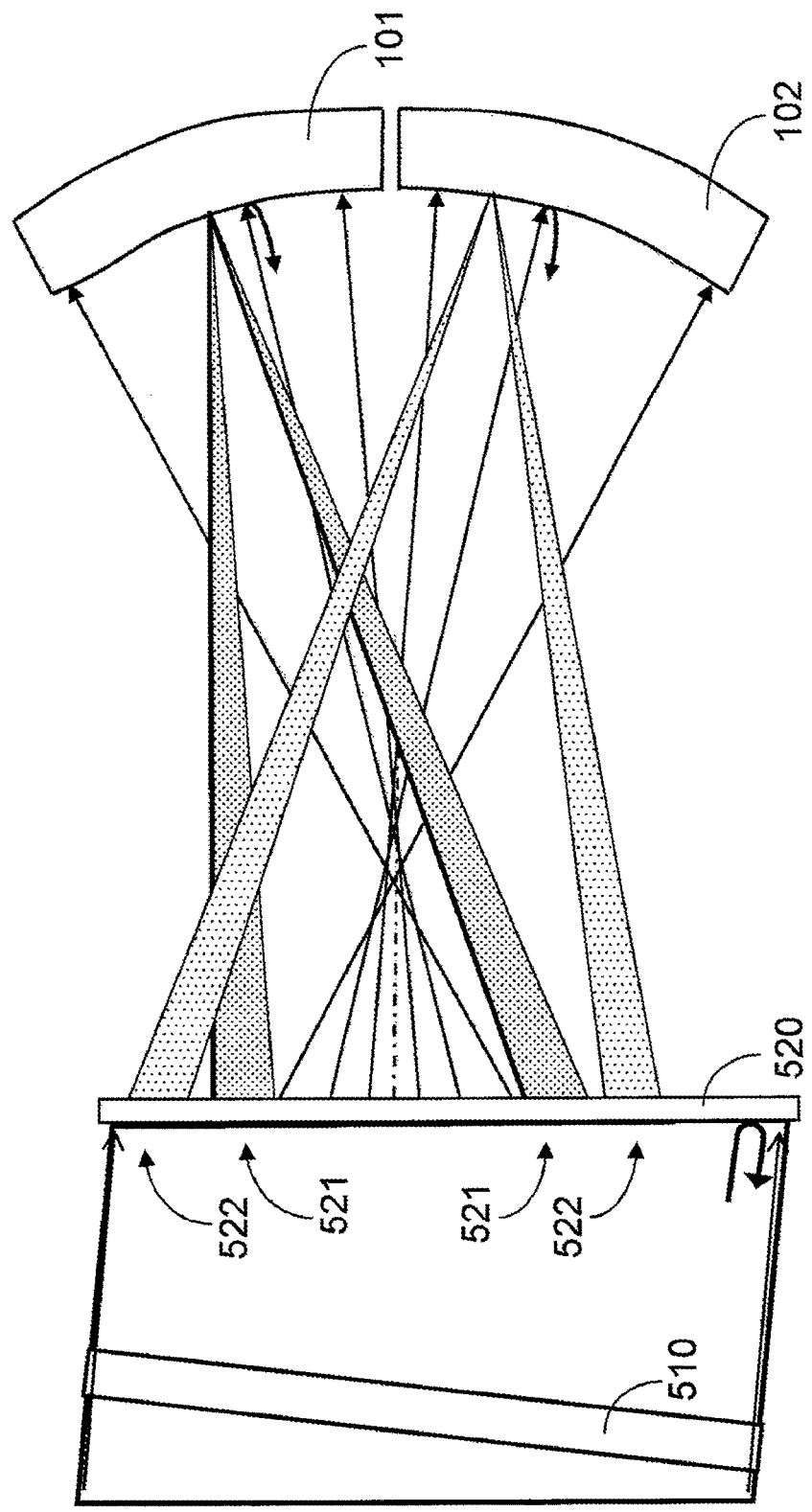

FIG. 5 shows a further embodiment, wherein, once again, components which are analogous or have substantially the same function are denoted by reference signs increased by "200" in relation to FIG. 3. In accordance with the arrangement of FIG. 5, different values of the quotient of geometric path and wavelength in the partial beam paths are not realized, like in FIG. 3, by generating the same geometric paths in conjunction with different wavelengths (by the use of a broadband light source in combination with an upstream cavity). Rather, different values are realized by using monochromatic light which, however, is guided via at least two different geometric paths to one and same point on the respective mirror segment 101, 102 via an auxiliary structure situated on the CGH 520.

In other words, in accordance with FIG. 5, different values of the quotient of geometric path and wavelength in the partial beam paths are realized by using a (single) discrete operating wavelength in combination with the generation of different geometric paths, with the latter being achieved by using an auxiliary structure ("reflective stud structure" made of a plurality of reflective studs 521, 522, . . . ) on the CGH 520. This auxiliary structure contained at the CGH 520 directs a focused wave onto the surface of the mirror segments 101, 102, which are respectively situated in the focus, and so the light is, once again, reflected back "onto itself" or returns from whence it came. As a result of this, the position of, firstly, the mirror segments 101, 102 and, secondly, the auxiliary structure at the CGH 520 is uniquely determined in space, wherein a shift of the respective mirror segment 101, 102 in the wavefront measured at the location of the auxiliary structure leads to a focal term. As a result of the focus being defined as a fixed point by the CGH 520, a shift of the respective mirror segment 101, 102 relative to this point consequentially leads to a change in the wavefront, and so the auxiliary structure is sensitive to such a distance change and permits a distance measurement of the mirror segments 101, 102.

The distance measurement of the mirror segments 101, 102 from the CGH 520 can, in principle, be carried out by way of a distance-measuring interferometer, as is conventionally used in distance-measuring interferometry. Other methods of distance-measuring interferometry are likewise possible.

Below, further embodiments of the invention are explained with reference to FIG. 6*ff.*, which embodiments respectively serve to detect wavefront jumps between the partial beam paths reflected by the individual mirror segments, whereby the fact that no light is reflected by the mirror segment boundaries in each case is taken into account. Here, two wavefronts required for interference are in each case generated by wavefront splitting of the wavefronts previously reflected at the mirror segments. Hence, wavefronts respectively generated by reflection at mutually adjacent mirror segments—between which wavefronts there respectively is a "wavefront gap" due to the mirror segment boundaries present between the mirror segments—are related to one another in interferometric terms.

Figure 6A:
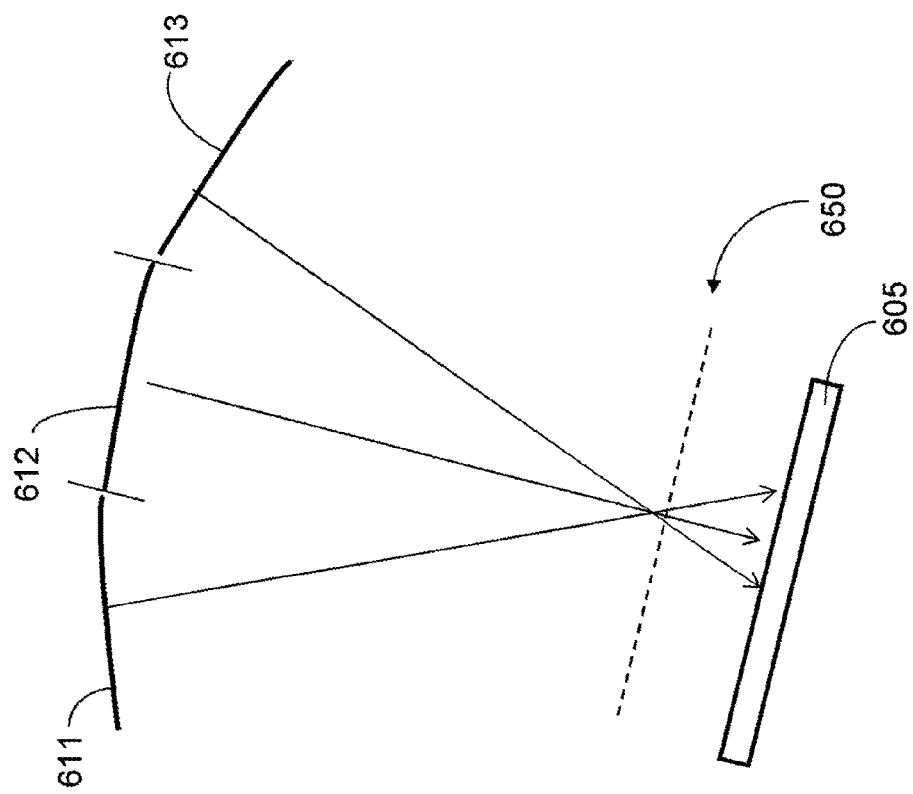
Figure 6B:
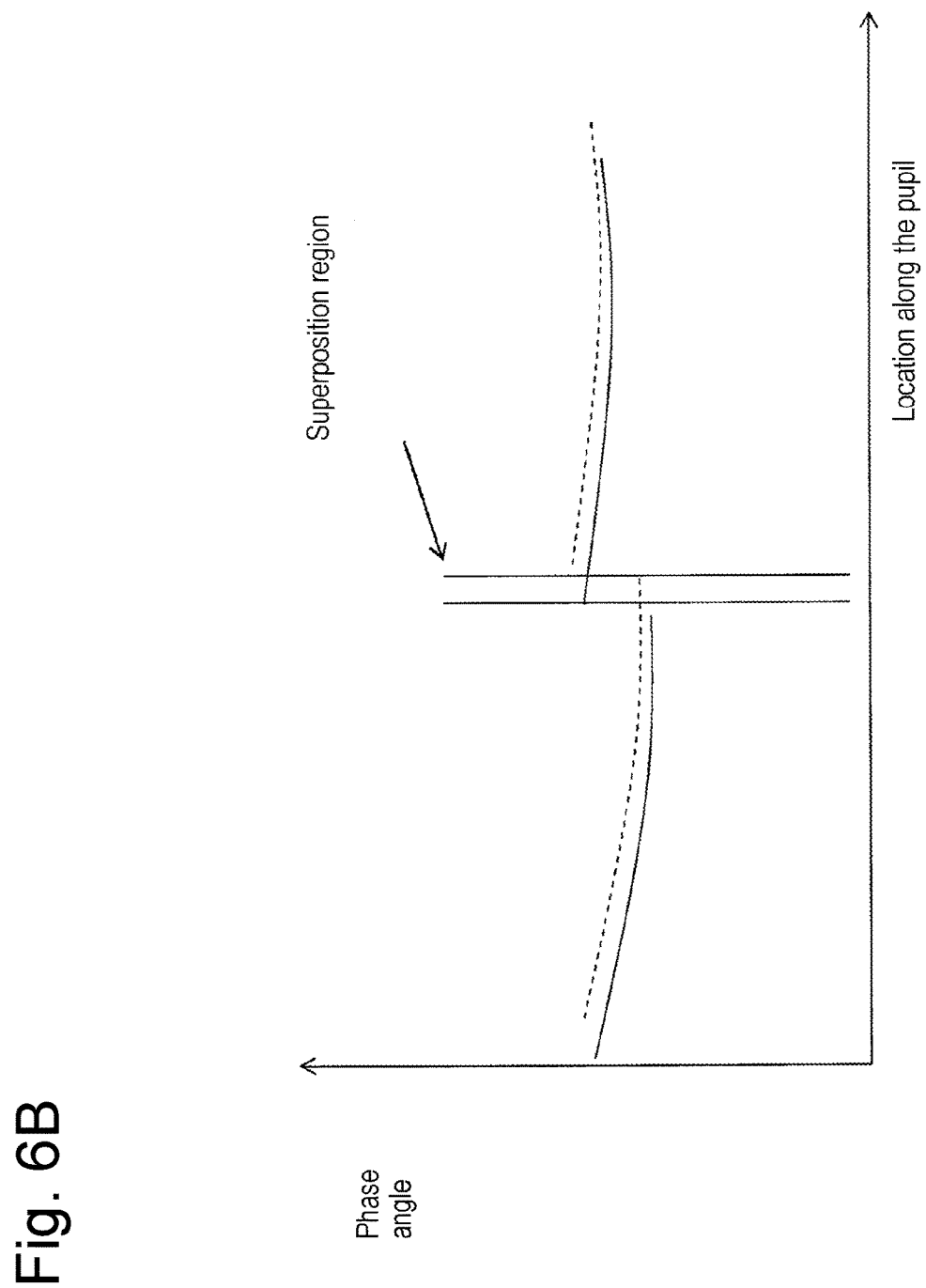

In accordance with FIGS. 6A-6B, this can be carried out using shearing interferometry. In FIG. 6A, 611, 612 and 613 denote the convergent wavefronts after reflection at the mirror segments 101, 102 of the segmented mirror. These wavefronts 611-613 are initially sheared over a shearing grating 650, whereupon a superposition of the respectively sheared wavefronts is brought about. In the shearing interferometer, a jump in the phase angle in adjacent wavefronts in accordance with FIG. 6B leads to a pronounced signal in the case of a superposition of the two sheared wavefronts which, in accordance with FIG. 6A, can be determined by a CCD camera 605 following the shearing grating 650 in the beam path. Phase angles of the individual mirror segments which do not correspond to one another can be brought into correspondence by a subsequent alignment. Here, in particular, a shearing interferometer, which is possibly already present in the projection exposure apparatus, can be used to detect the phase angle difference between the mirror segments.

Figure 7:
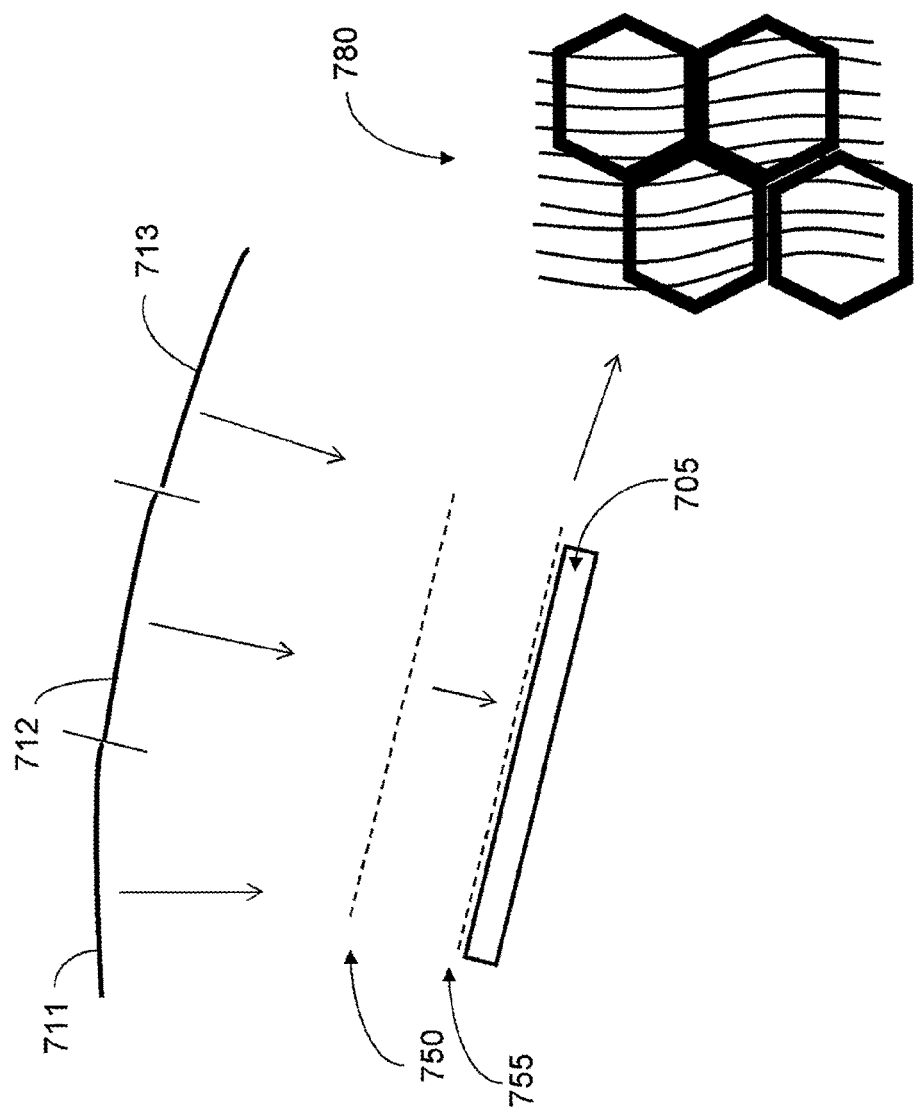

A Talbot interferometer can be used for the interferometric superposition in a further embodiment in accordance with FIG. 7. Here, as illustrated in FIG. 7, a self-imaging of a diffraction grating 750 due to the Talbot effect is initially produced. As a consequence of the "Moiré effect", the image of the diffraction grating 750 generated by this self-imaging generates a strip system 780 together with the image of a second diffraction grating 755 at the location of a CCD camera 705, in which strip system wavefront deviations are detectable by strip deformations; i.e., "kinks" in the wavefront have a signal in the "Moiré" strip system as a consequence. In accordance with this embodiment, the invention makes use of the fact that intensity gaps in the wavefront do not interfere with the evaluation since the strips which are still identifiable in the Talbot interferometer (as indicated in FIG. 7) merely have interpolatable gaps, but otherwise are not changed in terms of the paths they take.

Figure 8:
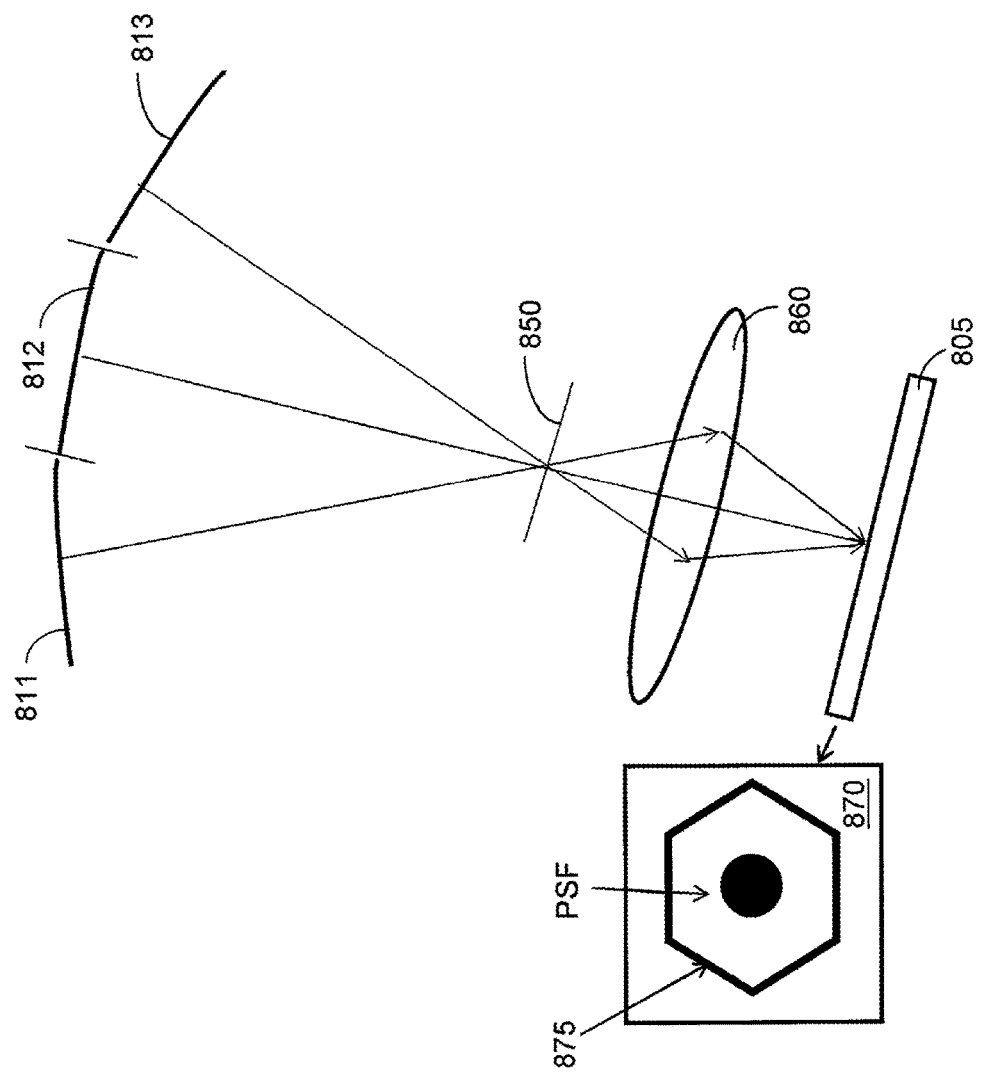

FIG. 8 serves to depict an additional feasible aerial image evaluation technique. In FIG. 8, 811, 812 and 813 once again denote the convergent wavefronts after reflection at the mirror segments of the segmented mirror. In accordance with FIG. 8, these are incident on a scintillator 850, wherein a magnifying imaging optical unit 860 following said scintillator in the beam path generates an aerial image 870 on a CCD camera 805. A deviation of the phase angle for one of the mirror segments and the phase jump resulting therefrom leads to the generation of stray light 875, which is visible in the aerial image 870 (as is merely schematically indicated in FIG. 8). Therefore, in order to bring the mirror segments into correspondence with respect their phase angle, the stray light 875 is removed by appropriately adjusting the mirror segments.

In a further embodiment, an aerial image evaluation can also be carried out in such a way that the phase angle of the incoming wave is deduced from the recorded aerial image using the so-called "phase retrieval" method.

In accordance with a further embodiment, the mirror segments can also be aligned in the view of a uniform phase angle by way of a lateral interferometric observation of the respective segment levels of the mirror segments, for the purposes of which an arrangement known from U.S. Pat. No. 8,228,485 B2 can be used (in that patent in conjunction with the actuation of a deformable mirror).

In accordance with a further embodiment, an interferometric determination of the respective segment levels of the mirror segments, carried out for aligning the mirror segments, can also be carried out using a Fabry-Perot interferometer, wherein use is made of the fact that the transmission properties react sensitively to the respective resonator length.

The mirror according to the invention, segmented with the correct phase, can be used to at least partly compensate for imaging aberrations of the projection lens. To this end, an actuation characteristic per mirror segment can initially be established using one of the described wavefront measurement techniques and a correction can subsequently be carried out using the same wavefront deviations. Moreover, there can be a direct optimization of the wavefront, even while avoiding an actuation characteristic being established.

Figure 10B:
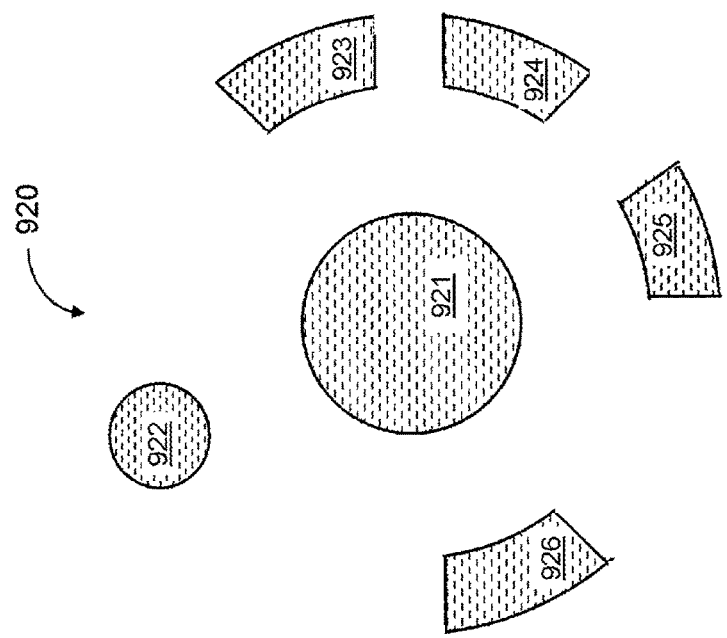
FIGS. 10A-12 show schematic illustrations for explaining further embodiments of the invention.
Figure 10A:
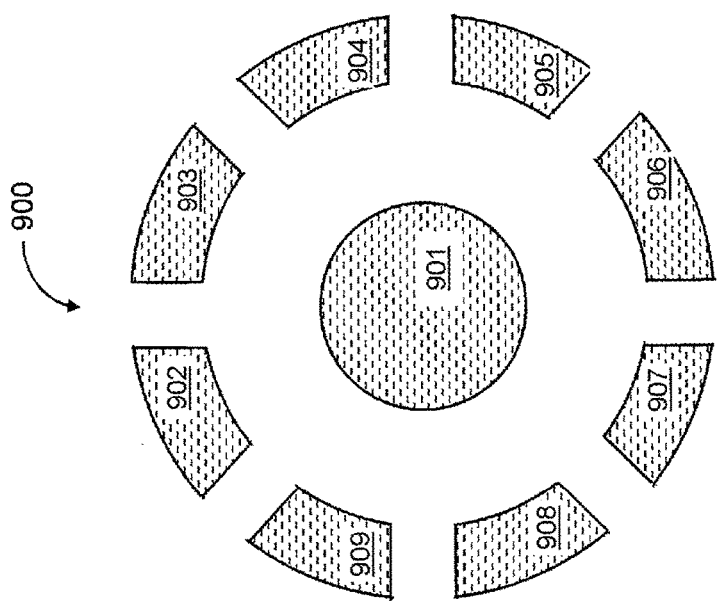

In embodiments of the invention, the mirror having a plurality of mirror segments can also be configured for transmitting or reflecting only some of the electromagnetic radiation during the operation of the optical system, namely by virtue of mirror segments—as only depicted in a schematic and exemplary manner in FIGS. 10A-10B—being provided only in specifically selected regions—and with comparatively large gaps remaining between these mirror segments. For example, in accordance with FIG. 10A, individual mirror segments 902-909 of a mirror 900 may be provided or added in the edge region in addition to a conventional central mirror segment 901, or a central mirror segment which does not have a further segmented embodiment, for the purposes of increasing the usable numerical aperture (NA). Herein, in accordance with FIG. 10A, the individual mirror segments can also be arranged with a relatively large spacing in both the radial and azimuthal direction. In a further example in accordance with FIG. 10B, mirror segments of a mirror 920 can be provided in a central region in relation to the optical system axis (mirror segment 921) and also—for the purposes of reflecting higher orders of diffraction—in a distant (edge) region in relation to the optical system axis, but provided only in regions in this edge region, for example for installation space reasons (mirror segment, 922-926). Here, the individual mirror segments can have essentially any geometric form, for example for matching to the respective conditions or installation space restrictions. Here, it is also possible to account for the fact that, depending on the employed illumination setting, individual regions are not used optically, or only used optically to a comparatively small extent.

Figure 11:
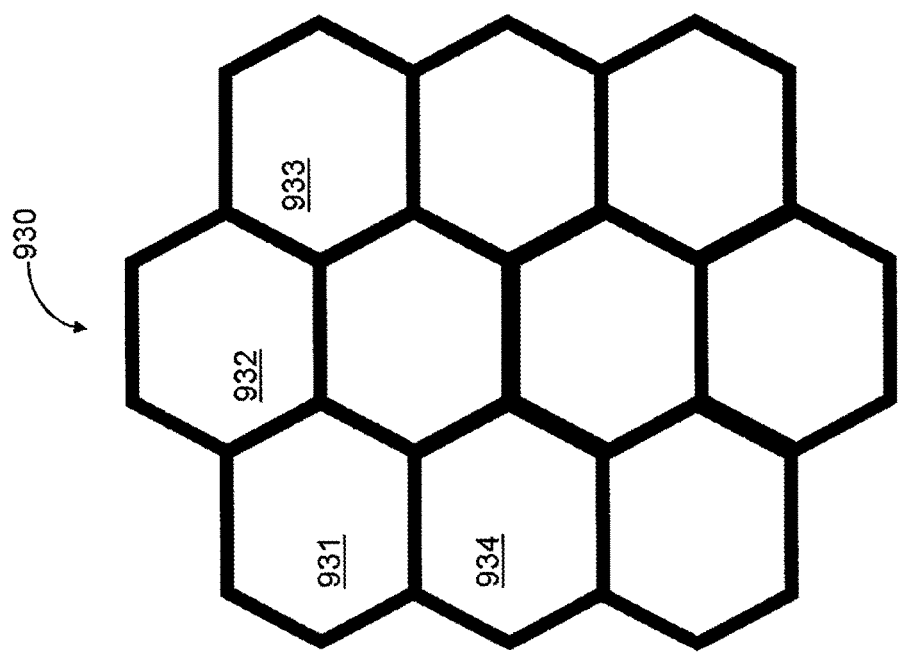

In accordance with FIG. 11, a further possible refinement of a mirror 930 according to the invention with a "phase-correct" segmentation contains a hexagonal ("honeycomb") form of the individual mirrors segments 931, 932, 933, . . . .

Figure 12:
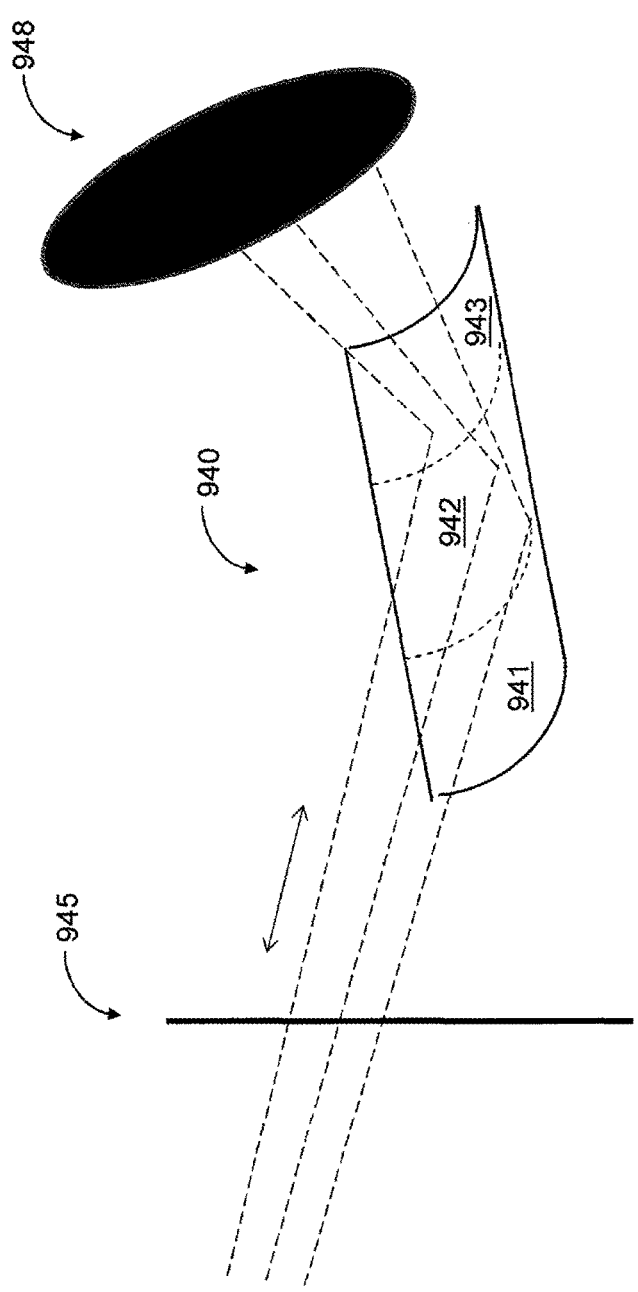

As depicted schematically in FIG. 12, a mirror according to the invention which has a plurality of mirror segments can also be, in further embodiments, a mirror 940 operated under grazing incidence. Such mirrors, which are also referred to as GI mirrors (="grazing incidence") and the use of which is fundamentally desirable in view of the comparatively high, achievable reflectivities (e.g. 80% and more), have a relatively pronounced mirror dimension as a consequence of the angle of incidence which is comparatively flat in relation to the reflecting mirror surface. Such a segmented refinement of a GI mirror can be realized in e.g. projection lenses with an arrangement as shown in DE 10 2012 202 675 A1.

The segmented mirror 940 depicted in FIG. 12, which is embodied as a GI mirror, has, only in an exemplary manner, an elongate, cylindrical basic form and is composed of mirror segments 941, 942 and 942. By way of example, the so-called "Ritchey-Common test" can be used for testing the mirror 940. Here, "948" denotes a concave mirror for reflecting the measurement light. The autocollimation of the measurement light rays is achieved by a CGH 945 disposed upstream thereof, wherein the employed interferometers may correspond to those in FIGS. 1-3.

Even though the invention has been described with reference to specific embodiments, numerous variations and alternative embodiments will become apparent to the person skilled in the art, e.g. through combination and/or exchange of features of individual embodiments. Accordingly, such variations and alternative embodiments are concomitantly encompassed by the present invention, and the scope of the invention is restricted only by the appended patent claims and the equivalents thereof.

What is claimed is:

1. A method for aligning a mirror of a microlithographic projection exposure apparatus, wherein the mirror comprises a plurality of mirror segments, said method comprising:
   projecting a beam towards the mirror comprising the plurality of mirror segments;
   generating an aerial image from a combination of a first wavefront of a first partial beam reflected at a first mirror segment of the mirror and a second wavefront of a second partial beam reflected at a second mirror segment of the mirror; and
   aligning the first mirror segment with the second mirror segment in accordance with an evaluation of the aerial image, wherein distances of the mirror segments from respective predetermined, hypothetical surfaces in a direction of the respective surface normals are less than $\lambda/10$ at each point on the mirror segments, where $\lambda$ denotes an operating wavelength of the mirror.

2. The method as claimed in claim 1, wherein the distances of the mirror segments from the predetermined hypothetical surfaces in the direction of the respective surface normals is less than $\lambda/100$ at each point on the mirror segments.

3. The method as claimed in claim 1 further comprising:
   determining a stray light component in the aerial image;
   wherein said aligning comprises aligning the first mirror segment and the second mirror segment in relation to one another in accordance with the determined stray light component.

4. The method as claimed in claim 1, further comprising replacing at least one of the mirror segments prior to said generating and said aligning.

5. The method as claimed in claim 1, wherein said generating and said aligning are performed during an assembling of the mirror.

6. The method as claimed in claim 1, wherein said generating and said aligning at least partly compensate for an imaging aberration of the microlithographic projection exposure apparatus.

7. The method as claimed in claim 1, wherein the mirror is configured for an operating wavelength of less than 200 nm.

8. The method as claimed in claim 1, wherein the mirror is configured for an operating wavelength of less than 30 nm.

9. The method according to claim 1, further comprising:
generating further aerial images from further respective wavefronts reflected at further mirror segments; and
aligning the further mirror segments in relation to the first mirror segment and/or the second mirror segment, to produce the aligned mirror.

10. A method for aligning a mirror of a microlithographic projection exposure apparatus, wherein the mirror comprises a plurality of mirror segments, said method comprising:
projecting a beam towards the mirror comprising the plurality of mirror segments;
generating an aerial image from a combination of a first wavefront of a first partial beam reflected at a first mirror segment of the mirror and a second wavefront of a second partial beam reflected at a second mirror segment of the mirror; and
aligning the first mirror segment with the second mirror segment in accordance with an evaluation of the aerial image, wherein distances of the mirror segments from respective predetermined, hypothetical surfaces in a direction of the respective surface normals are less than $\lambda/10$ at each point on the mirror segments, where $\lambda$ denotes an operating wavelength of the mirror,
wherein projecting the beam towards the mirror comprises using electromagnetic radiation at a first wavelength for a pre-aligning and, subsequent to the pre-aligning, using electromagnetic radiation at a second wavelength, which is shorter than the first wavelength for a fine aligning.

11. A method for aligning a mirror of a microlithographic projection exposure apparatus, wherein the mirror comprises a plurality of mirror segments, said method comprising:
projecting a beam towards the mirror comprising the plurality of mirror segments;
generating an aerial image from a combination of a first wavefront of a first partial beam reflected at a first mirror segment of the mirror and a second wavefront of a second partial beam reflected at a second mirror segment of the mirror; and
aligning the first mirror segment with the second mirror segment in accordance with an evaluation of the aerial image, wherein distances of the mirror segments from respective predetermined, hypothetical surfaces in a direction of the respective surface normals are less than $\lambda/10$ at each point on the mirror segments, where $\lambda$ denotes an operating wavelength of the mirror,
wherein generating the aerial image comprises:
arranging a scintillator in an optical path of the first wavefront and the second wavefront to form a scintillated beam;
arranging a magnifying imaging optical unit in the beam path of the scintillated beam to form a magnified beam; and
arranging a charge coupled device camera in the magnified beam to generate the aerial image.

12. The method as claimed in claim 11, wherein the distances of the mirror segments from the predetermined hypothetical surfaces in the direction of the respective surface normals is less than $\lambda/100$ at each point on the mirror segments.

13. The method as claimed in claim 11, further comprising:
determining a stray light component in the aerial image;
wherein said aligning comprises aligning the first mirror segment and the second mirror segment in relation to one another in accordance with the determined stray light component.

14. The method as claimed in claim 11, further comprising replacing at least one of the mirror segments prior to said generating and said aligning.

15. The method as claimed in claim 11, wherein said generating and said aligning are performed during an assembling of the mirror.

16. The method as claimed in claim 11, wherein said generating and said aligning at least partly compensate for an imaging aberration of the microlithographic projection exposure apparatus.

17. The method as claimed in claim 11, wherein the mirror is configured for an operating wavelength of less than 200 nm.

18. The method as claimed in claim 11, wherein the mirror is configured for an operating wavelength of less than 30 nm.

19. The method as claimed in claim 11, further comprising:
generating further aerial images from further respective wavefronts reflected at further mirror segments; and
aligning the further mirror segments in relation to the first mirror segment and/or the second mirror segment, to produce the aligned mirror.

\* \* \* \* \*

UNITED STATES PATENT AND TRADEMARK OFFICE
CERTIFICATE OF CORRECTION

| | |
|---|---|
| PATENT NO. | : 10,101,667 B2 |
| APPLICATION NO. | : 15/284967 |
| DATED | : October 16, 2018 |
| INVENTOR(S) | : Rolf Freimann et al. |

It is certified that error appears in the above-identified patent and that said Letters Patent is hereby corrected as shown below:

On the Title Page

Page 2, Column 2, Line 13, item (56), Delete "computer-jeneratedHolograms"," and insert -- computer-generated Holograms", --, therefor.

In the Specification

Column 1, Line 57, Delete "NA:" and insert -- NA. --, therefor.

Column 6, Line 65, Delete "abeam" and insert -- a beam --, therefor.

Signed and Sealed this
Third Day of September, 2019

Andrei Iancu
*Director of the United States Patent and Trademark Office*